(12) United States Patent
Hung et al.

(10) Patent No.: US 8,723,563 B2
(45) Date of Patent: May 13, 2014

(54) APPARATUS AND METHOD TO TOLERATE FLOATING INPUT PIN FOR INPUT BUFFER

(71) Applicant: Macronix International Co., Ltd., Hsinchu (TW)

(72) Inventors: Chun-Hsiung Hung, Hsinchu (TW); Kuen-Long Chang, Taipei (TW); Nai-Ping Kuo, Hsinchu (TW); Ming-Chih Hsieh, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/845,576

(22) Filed: Mar. 18, 2013

(65) Prior Publication Data

US 2013/0214820 A1 Aug. 22, 2013

Related U.S. Application Data

(63) Continuation of application No. 12/565,624, filed on Sep. 23, 2009, now Pat. No. 8,400,190.

(51) Int. Cl.
*H03K 3/00* (2006.01)

(52) U.S. Cl.
USPC .......................................................... 327/108

(58) Field of Classification Search
None
See application file for complete search history.

(56) References Cited

U.S. PATENT DOCUMENTS

2006/0038593 A1\* 2/2006 Abe ............................... 327/112

\* cited by examiner

*Primary Examiner* — Lincoln Donovan
*Assistant Examiner* — Khareem E Almo
(74) *Attorney, Agent, or Firm* — Kenta Suzue; Haynes Beffel & Wolfeld LLP

(57) ABSTRACT

An integrated circuit device includes a pad adapted to receive a signal from an internal or external driver, and an input buffer circuit including an input terminal coupled to the pad. The input buffer circuit includes a pass transistor having a control terminal, a first conduction terminal connected to the pad, and a second conduction terminal connected to a first voltage. The input buffer circuit also includes a latch having a terminal electrically coupled to the control terminal of the pass transistor. The input buffer circuit further includes circuitry coupled to the latch, the circuitry including a feedback transistor having a control terminal electrically coupled to the pad, a first conduction terminal electrically coupled to a second voltage, and a second conduction terminal coupled to the latch.

16 Claims, 8 Drawing Sheets

APPARATUS AND METHOD TO TOLERATE FLOATING INPUT PIN FOR INPUT BUFFER

RELATED APPLICATIONS

This application is a continuation of U.S. patent application Ser. No. 12/565,624, filed on 23 Sep. 2009 entitled Apparatus and Method to Tolerate Floating Input Pin for Input Buffer and incorporated herein by reference.

BACKGROUND OF THE INVENTION

1. Field of the Invention

The present invention relates generally to integrated circuits, and more particularly to pull-up and pull-down circuitry for input/output pads of integrated circuits.

2. Description of Related Art

Integrated circuits include input/output (I/O) pads used for receiving and transmitting signals. During operation, if an I/O pad is left "floating", meaning that the pad is not being driven to a known voltage by external or internal drivers, the pad may float at a voltage level sufficient to cause input buffer circuitry connected to the pad to turn-on and operate unpredictably. This unpredictable operation increases power consumption for the device and may cause damage to the input buffer circuitry. A floating voltage on the pad may also place the input buffer circuitry in an indeterminate state, resulting in indeterminate signals propagating to the internal circuitry of the device and causing oscillations and other spurious effects.

In order to avoid such issues, integrated circuits typically include pull-up or pull-down circuitry to bias the pad to a known voltage when the pad is left in a floating condition.

FIG. 1A is a schematic diagram of prior art input/output circuitry for a pad 105 of an integrated circuit device 100. The input/output circuitry includes input buffer circuitry 110, output buffer circuitry 120, and resistive weak pull-up circuitry 130.

Input buffer circuitry 110 has an input terminal 111 connected to the pad 105. The input buffer circuitry 110 includes a p-channel transistor 112 and an n-channel transistor 114, which act as a buffer to improve the signal integrity of the input signal applied to the pad 105. When a logic high voltage is applied to the pad 105, transistor 114 is turned off and transistor 112 is turned on, thereby coupling the supply voltage VDD to the output terminal 113 of the input buffer circuitry 110. When a logic low voltage is applied to the pad 105, transistor 114 is turned on and transistor 112 is turned off, thereby coupling the output terminal 113 to ground.

Thus, when operating properly, input voltage levels applied to the pad 105 by external sources are buffered by the input buffer circuitry 110, and the output terminal 113 of the input buffer circuitry 110 coupled to internal circuitry (not shown) provides the input signal for the integrated circuit device 100.

Output buffer circuitry 120 includes an input terminal 121 to receive an output signal from the internal circuitry of the integrated circuit device 100, and has an output terminal 122 connected to the pad 105. When an output enable signal is asserted, the pad is operated as an output pad and the output buffer circuitry 120 drives the pad 105 in response to the voltage level of the output signal. When the output enable signal is not asserted, the output 122 of the output buffer circuitry 120 is in a high-impedance "tri-state".

During operation of the device 100, if the pad 105 is left to float, the voltage level on the pad 105 may cause pull-up transistor 112 and/or pull-down transistor 114 of the input buffer circuitry 110 to turn-on and conduct current. The floating voltage on the pad 105 can also place the output terminal 113 of the input buffer circuitry 110 into an indeterminate state, resulting in indeterminate signals propagating to the internal circuitry of the device 100. These indeterminate signals can cause oscillations and other spurious effects in the internal circuitry of the device 100.

If left floating, the voltage on the pad 105 may also cause both pull-up transistor 112 and pull-down transistor 114 to turn-on simultaneously, resulting in a significant cross-bar current flowing from $V_{DD}$ to ground through the transistors 112, 114. The cross-bar current can damage the input buffer circuitry 110 and cause failure of the device 100.

Thus in order to prevent a floating voltage on the pad 105, weak resistive pull-up circuit 130 is located between the pad 105 and the bias voltage $V_{DD}$. The resistive pull-up circuit 130, consisting of a resistor or diode-connected transistor, biases the pad 105 to the bias voltage $V_{DD}$ when the pad 105 is not being driven by external or internal drivers. The pull-up circuit 130 is designed to be weak enough to be easily overdriven when the pad 105 is driven to a low voltage state by an external or internal driver. The resistive pull-up circuit 130 thus acts to prevent the pad 105 from floating and ensures that the input buffer circuitry 110 is in a known state when the pad 105 is not being driven by internal or external drivers. Alternatively, a resistive pull-down circuit 140 may be implemented as shown in FIG. 1B, to bias the pad 105 to ground when the pad 105 is not being driven.

One drawback to the use of resistive pull-up or pull-down circuits 130, 140 is that they consume significant amounts of power when the pad 105 is driven to a voltage level opposite that of the self-biased voltage level provided by the circuits 130, 140. Another drawback is that the current path through the resistive pull-up or pull-down circuits 130, 140 loads the pad 105 when the pad 105 is being driven by the output buffer circuitry 120, which impacts the output transient time of the device 100.

It is therefore desirable to provide improved pull-up and/or pull-down circuitry for pads of integrated circuits that minimize current consumption for the circuit and address the loading issues discussed above.

SUMMARY OF THE INVENTION

An integrated circuit device described herein includes a pad adapted to receive a signal from an internal or external driver. An input buffer circuit has an input terminal coupled to the pad, and has an output terminal providing an input signal to internal circuitry of the integrated circuit.

The input buffer circuit includes a pass transistor having a control terminal, a first conduction terminal electrically coupled to the pad, and a second conduction terminal connected to a first voltage (e.g. $V_{DD}$). The input buffer circuit also includes a latch having a terminal electrically coupled to the control terminal of the pass transistor.

The input buffer circuit also includes circuitry coupled to the latch. The circuitry includes a feedback transistor having a control terminal electrically coupled to the pad, a first conduction terminal electrically coupled to the pad, and a second conduction terminal electrically coupled to the latch.

A first state in the latch turns on the pass transistor to electrically couple the pad to the reference voltage. A second state in the latch turns off the pass transistor to electrically decouple the pad from the reference voltage. The circuitry coupled to the latch is responsive to an initialization event to establish the first state in the latch. Establishing the first state in the latch turns on the pass transistor to electrically couple the pad to the first voltage and "pre-charge" the pad. This prevents the pin from floating following the initialization event, and thus ensures that the input buffer circuitry is in a known state following the initialization event. The initialization event may be for example, a power-up event of the device, or any other event which could lead to an indeterminate floating voltage on the pad.

The circuitry coupled to the latch is further responsive to a change in voltage on the pad caused by the internal or external driver, to establish the second state in the latch. The second state in the latch turns off the pass transistor to electrically decouple the pad from the first voltage.

By turning off the pass transistor when the pad is being driven by internal or external drivers, the load of the "pre-charge" current path through the pass transistor is removed, saving power and allowing higher speed operation.

Methods for biasing a pad of an integrated circuit described herein include electrically coupling the pad to a voltage in response to an initialization event. The voltage on the pad is then monitored to detect a change in voltage indicating that the pad is being driven by the internal or external driver. Upon detecting said change in voltage, the pad is electrically decoupled from the voltage.

Other aspects and advantages of the present invention can be seen on review of the drawings, the detailed description, and the claims which follow.

DETAILED DESCRIPTION

A detailed description of embodiments of the present invention is provided with reference to FIGS. 2-7.

Figure 2:
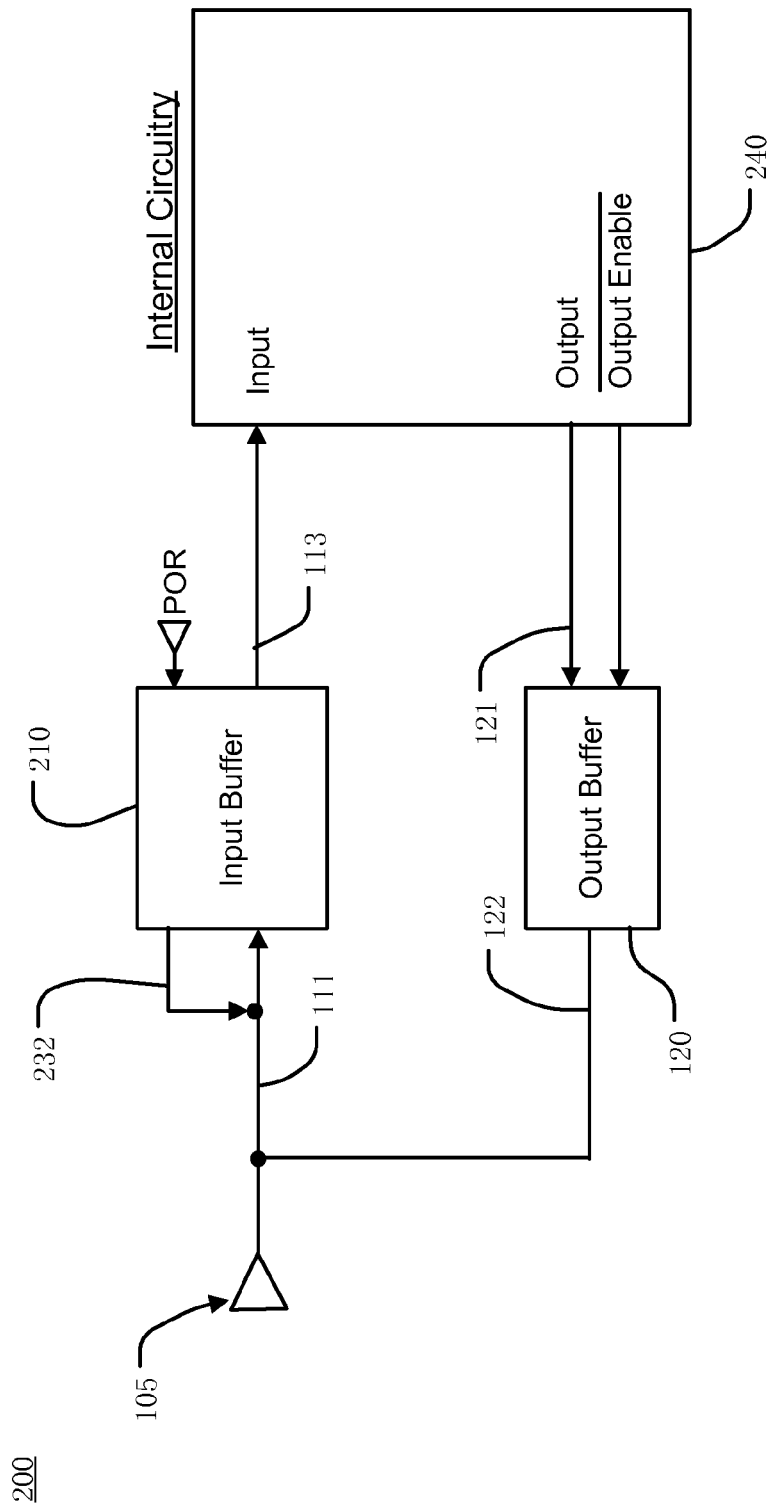
FIG. 2 is a simplified functional block diagram of input/output circuitry for an input/output pin of a semiconductor device, including an input buffer circuit as described herein.

FIG. 2 is a simplified functional block diagram of input/output circuitry for a pad 105 of an integrated circuit device 200. The device 200 includes an input buffer circuit 210 as described herein. As used herein, the term "pad" refers to any externally accessible circuit node adapted to receive a signal from an internal or external driver.

As shown in FIG. 2, the input buffer circuit 210 includes an input terminal 111 connected to the pad 105, and has an output terminal 113 coupled to internal circuitry 240 to provide the input signal for the integrated circuit device 200.

Figure 1A:
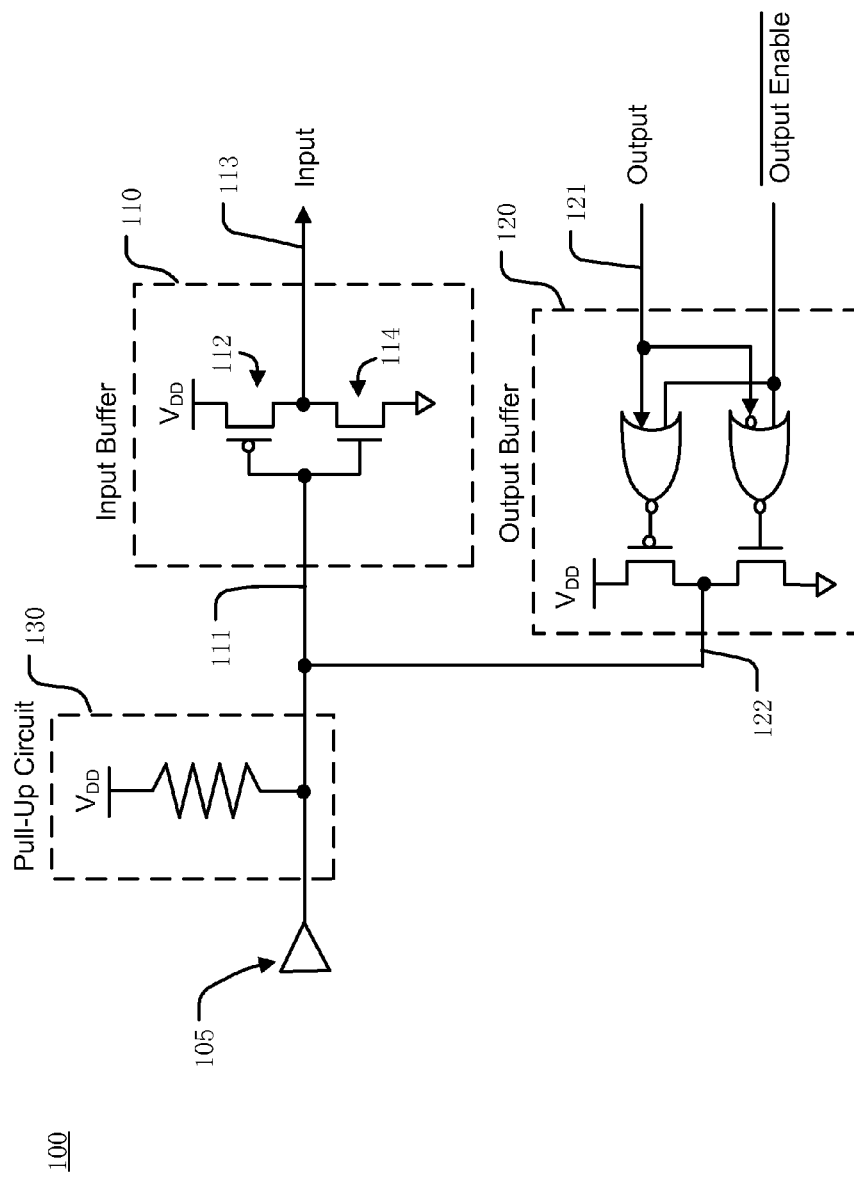
FIG. 1A is a schematic diagram of prior art input/output circuitry for an I/O pin of a semiconductor device including a resistive pull-up circuit.
Figure 1B:
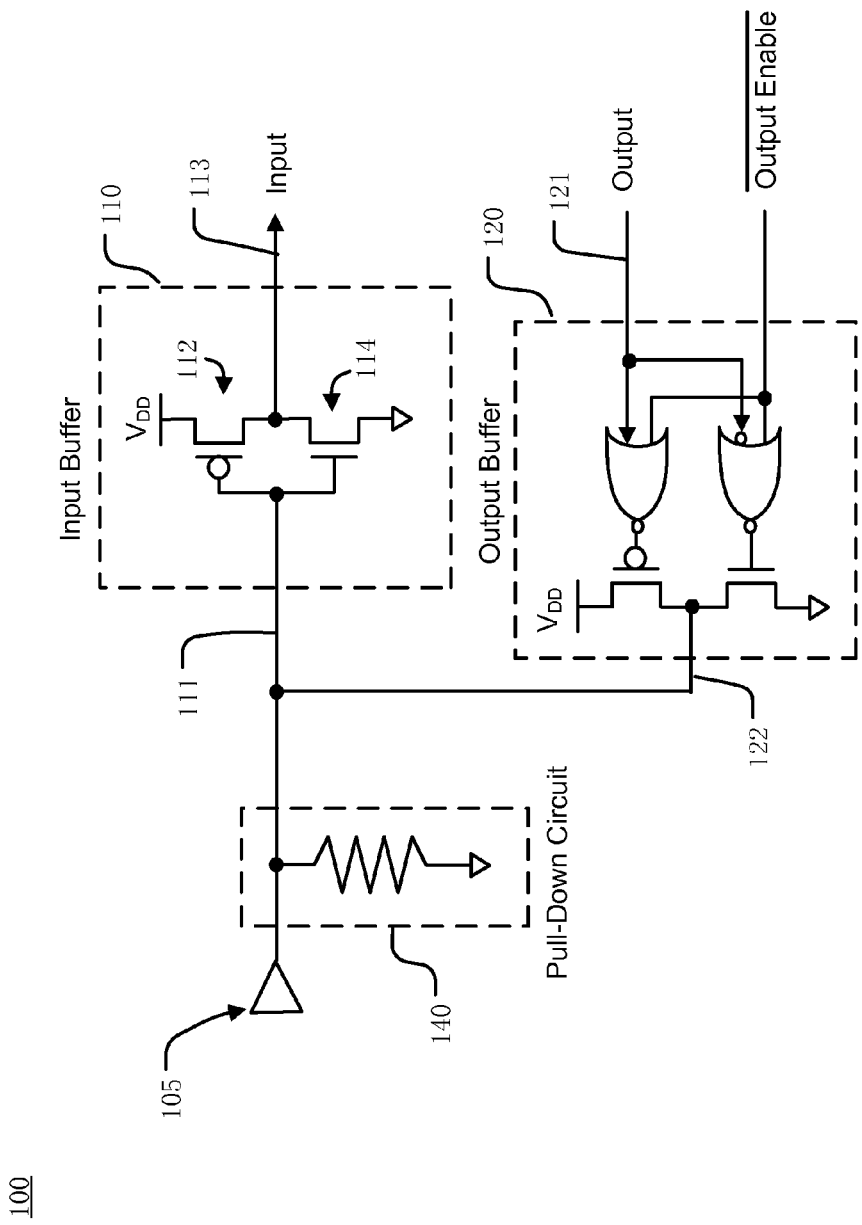
FIG. 1B is a schematic diagram of prior art input/output circuitry for an I/O pin of a semiconductor device including a resistive pull-down circuit.

The circuitry of the input buffer circuit 210 used for providing the input signal for the integrated circuit may be implemented, for example, using the pull-up and pull-down transistors 112, 114 as shown in FIGS. 1A-1B. Alternatively, other circuits may be used.

The device 200 also includes output buffer circuitry 120 having an input terminal 121 to receive an output signal from the internal circuitry 240, and has an output terminal 122 connected to the pad 105. When the output enable signal is asserted, the pad 105 is operated as an output pad and the output buffer circuitry 120 drives the pad 105 in response to the voltage level of the output signal. When the output enable signal is not asserted, the output 122 of the output buffer circuitry is in a high-impedance "tri-state".

The output buffer circuitry 120 may be implemented, for example, as shown in FIGS. 1A-1B. Alternatively other circuits for implementing the output buffer circuitry 120 may be used. In the illustrated embodiment the device 200 includes both the input and output buffer circuitry 210, 120 coupled to the pad 105, and thus the pad 105 is an input/output pad. In alternative embodiments the output buffer circuitry 120 may be omitted, the pad 105 thus being an input pad.

Figure 3:
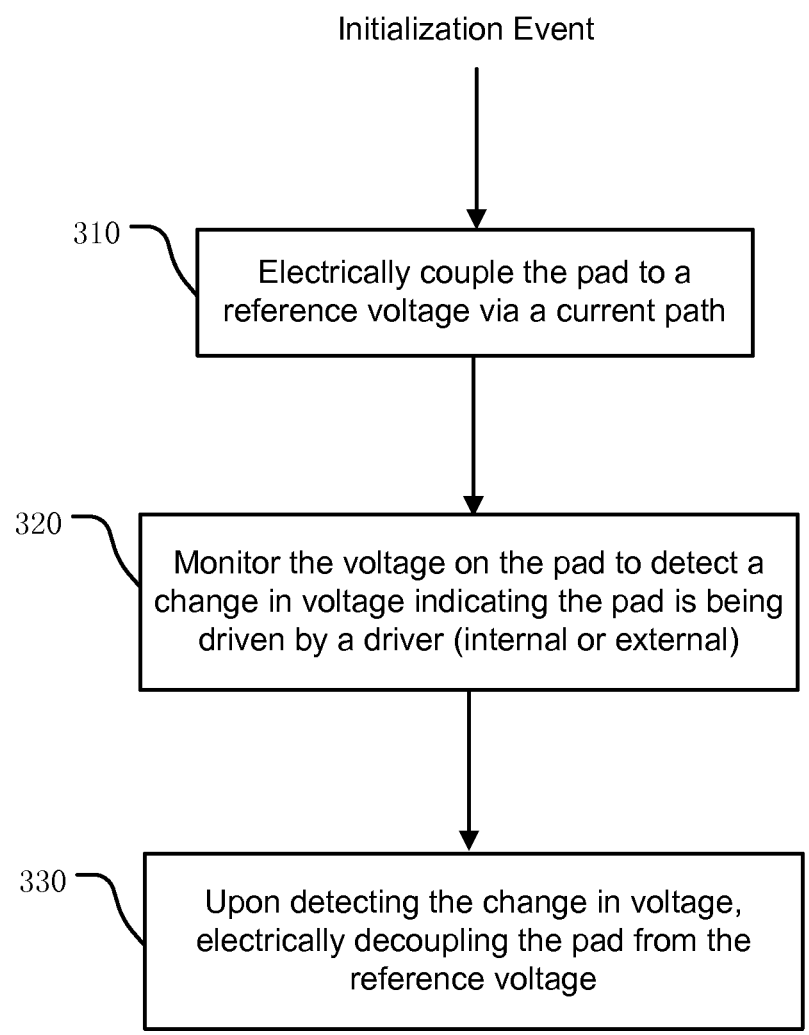
FIG. 3 is a flow diagram of a method for biasing the pad by selectively coupling the pad to a reference voltage via a current path.

The input buffer circuitry 210 includes an output terminal 232 which selectively couples a reference voltage to the pad 105 to prevent the pad 105 from floating at an indeterminate voltage following an initialization event. FIG. 3 is a flow diagram of a method 300 for selectively coupling the pad 105 to the reference voltage.

The method 300 begins at block 310 in response to the initialization event. The initialization event may be, for example, a power-up event of the device 200, or any other event which could lead to an indeterminate floating voltage on the pad 105.

The input buffer circuitry 210 is responsive to the initialization event to electrically couple the pad 105 to a reference voltage via a current path (block 310). The reference voltage is a voltage not subject to being indeterminate following the occurrence of the initialization event. For example, the reference voltage may be a bias voltage provided on an external supply line to the integrated circuit device 200. As another example, the reference voltage may be ground. Other voltages may also be used.

The voltage on the pad 105 is thus "pre-charged" to the reference voltage via the current path. As a result, the pad 105 is prevented from floating at an indeterminate voltage, and thus ensures that the input buffer circuitry 210 is in a known state following the initialization event.

The current path is said to be "weak" in the sense that when a voltage different from the pre-charged voltage is asserted on the pad 105 by an internal or external driver, the driver provides a stronger pull-down or pull-up action than the current path's pull-up or pull-down action. The internal or external driver thus "wins", and changes the voltage on the pad 105.

Next, at block 320 the voltage on the pad 105 is monitored to detect a change in voltage above a predetermined value indicating that the pad 105 is being driven by an internal or external driver. The voltage can be monitored, for example, by detecting a change in voltage sufficient to turn on a feedback transistor having a control terminal coupled to the pad 105 (discussed in more detail below). It will be understood that the detection of the change in voltage indicating the pad 105 is being driven may occur some time after the driver has begun asserting a voltage on the pad 105.

Upon detection of the change in voltage on the pad 105, the input buffer circuitry 210 electrically decouples the pad 105 from the reference voltage (block 330) by turning off the current path. By turning off the current path when the pad is being driven by internal or external drivers, the load of the "pre-charge" current path is removed, saving power and allowing higher speed operation.

Figure 4:
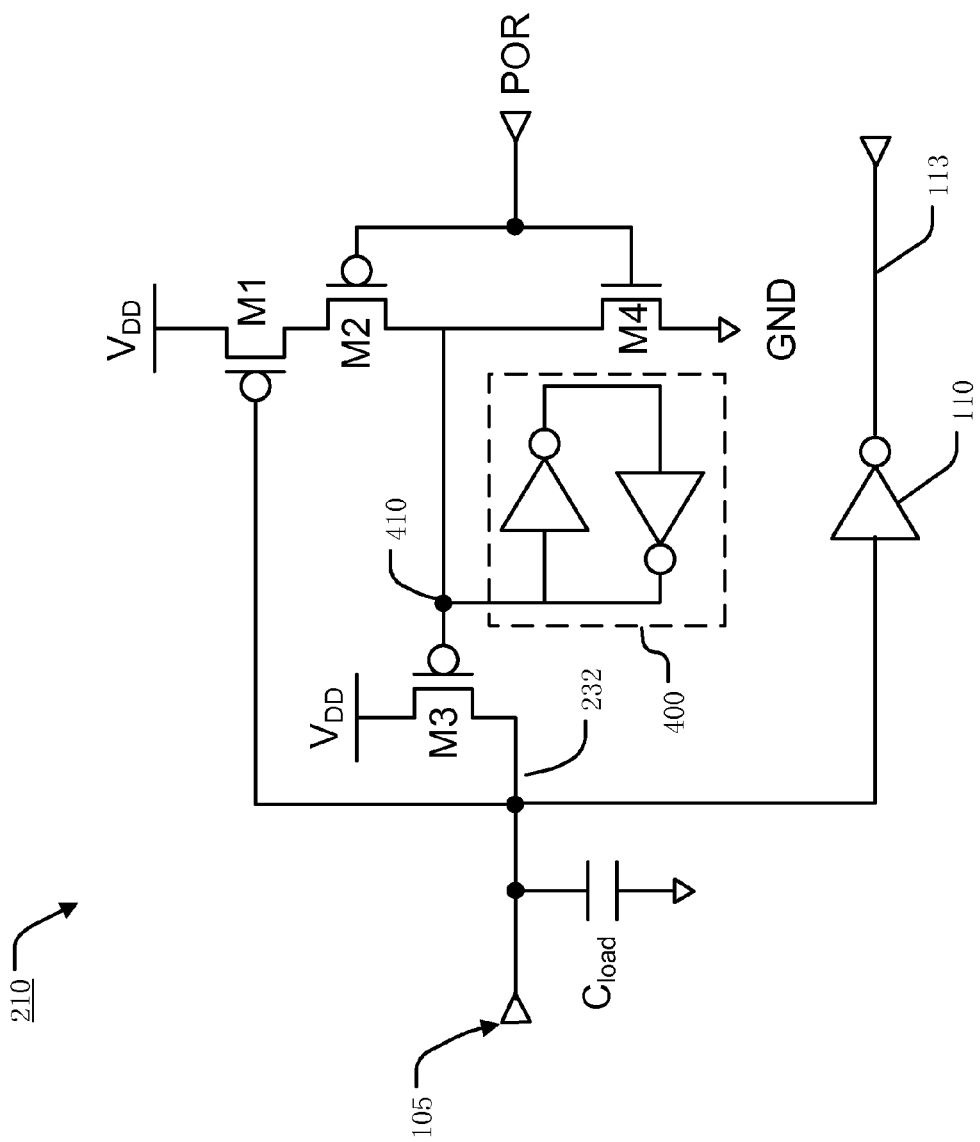
FIG. 4 is a schematic diagram of a first embodiment of the input buffer circuit of FIG. 2.

FIG. 4 illustrates a first embodiment of the input buffer circuitry 210 for the integrated circuit device 200. As shown in FIG. 4, the input buffer circuitry 210 includes PMOS pass transistor M3 having a first conduction terminal connected to the output terminal 232, a second conduction terminal connected to a reference voltage ($V_{DD}$ in this example), and a control terminal coupled to a terminal of the latch circuit 400 at node 410. The pass transistor M3 is turned-on and off to selectively couple the output terminal 232 to reference voltage $V_{DD}$, depending upon whether the state of the latch 400 is low or high.

The latch 400 can be implemented using a pair of cross-coupled invertors. Alternatively, other circuits may be used to implement the latch 400.

Figure 5:
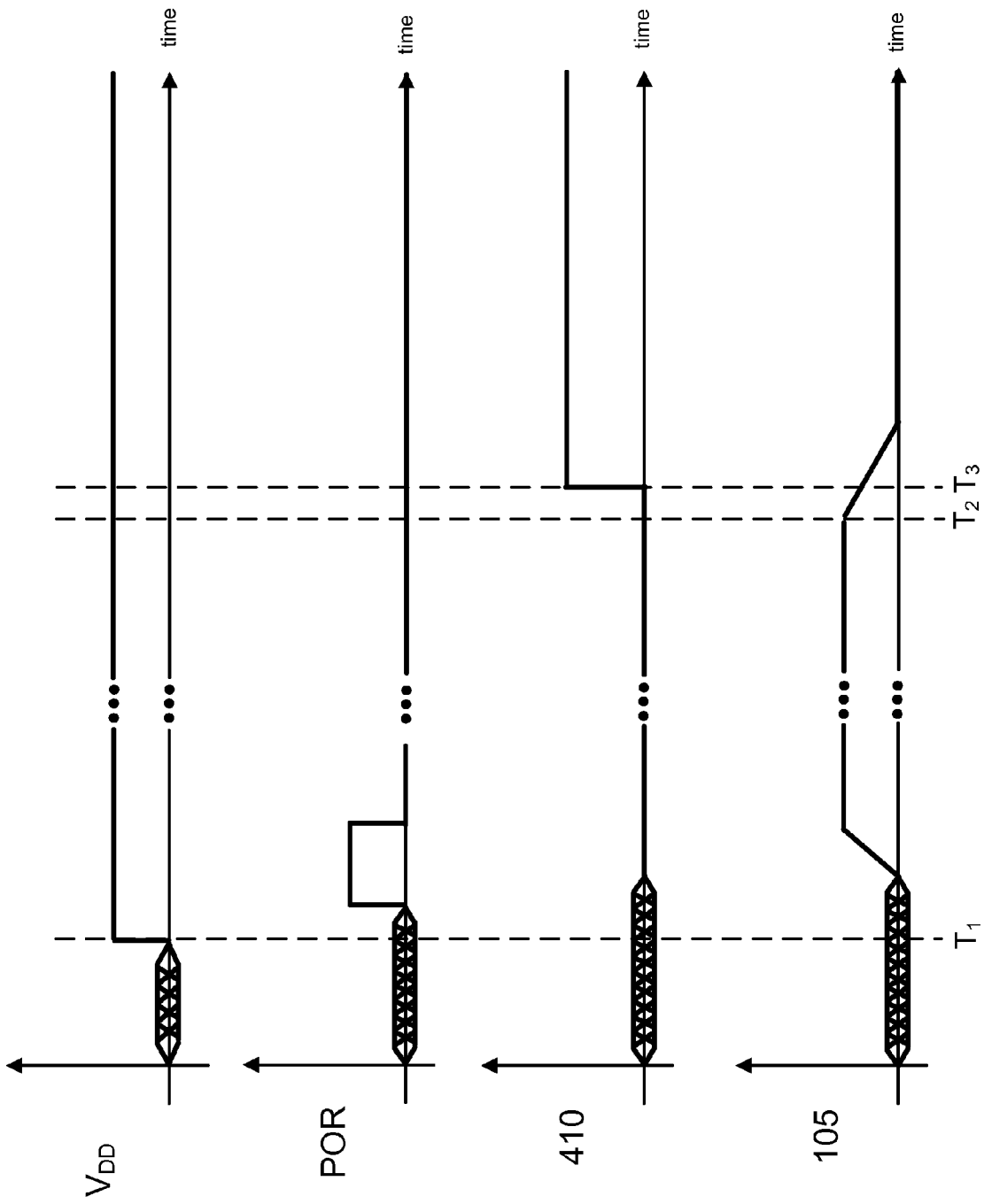
FIG. 5 illustrates a timing diagram for operating the architecture of FIG. 4.

FIG. 5 illustrates an embodiment of a timing diagram for operating the architecture of FIG. 4 using the methods described herein. As will be understood the timing diagram of FIG. 5 is simplified and not necessarily to scale.

The sequence begins at time $T_1$ in response to an initialization event. In the illustrated example, the initialization event is a power-up event during which the internal circuitry 240 generates a power-on reset "POR" signal in response to the application of power to the integrated circuit device 200. More generally, the initialization event may be any other event which could lead to an indeterminate floating voltage on the pad, for which a signal is generated internally or externally to begin the sequence.

During the power-on process, the POR signal is set to a high state by the internal circuitry 240 which turns on transistor M4 and couples node 410 to ground (GND), thereby resetting the latch 400 to a low state. Following the power-on process the POR signal is returned to a low state, which turns off transistor M4 and turns on transistor M2.

The latch 400, when in the low state, turns on the pass transistor M3 to couple the output terminal 232 to the reference voltage $V_{DD}$, thereby pre-charging and holding the pad 105 at the reference voltage $V_{DD}$ via the pre-charge current path through the pass transistor M3. Other reference voltages may alternatively be used. Pre-charging and holding the pad 105 via the pass transistor M3 prevents the pad 105 from floating following the initialization event, which ensures that the buffer circuitry 110 is in a known state.

The time required to pre-charge the pad 105 depends upon the current drive provided by the pass transistor M3 as well as equivalent loading capacitance $C_{load}$ of the pad 105, which will vary from embodiment to embodiment. For example, $C_{load}$ may be from 10 to 100 picofarads, and the pre-charge time may be between several to tens of microseconds.

The pass transistor M3 is said to be "weak" in the sense that when a voltage less than the reference voltage is asserted on the pad 105 by an internal or external driver, the driver provides a stronger pull-down action than the pull-up action of the pass transistor M3. The internal or external driver thus "wins", and changes the voltage at the pad 105.

The voltage on the pad 105 is then monitored to detect a change in voltage sufficient to turn on the feedback transistor M1 having a control terminal coupled to the pad 105. At time $T_2$ a driver (internal or external) begins pulling down the voltage on the pad, and at time $T_3$ the voltage is pulled down below the threshold of the PMOS feedback transistor M1. Turning on transistor M1 couples node 410 to $V_{DD}$, which sets the latch to a high state to turn off the pass transistor M3. This electrically decouples the reference voltage $V_{DD}$ from the pad 105.

Since the voltage on the pad 105 only needs to drop below the threshold voltage of M1 before the latch 400 is set and the pass transistor M3 is turned off, the period of time that the pass transistor M3 is "fighting" the assertion is short.

The high voltage on node 410 is then maintained by the high state in the latch 400 while the pad is being driven by internal or external drivers, and thus the pass transistor M3 remains off By turning off the pass transistor M3 when the pad 105 is being driven by internal or external drivers, the load of the "pre-charge" current path through the pass transistor M3 is removed, saving power and allowing higher speed operation.

In the illustrated embodiment of FIGS. 4 and 5, the pad 105 is pre-charged to a high reference voltage in response to the initialization event, and the voltage on the pad is monitored to detect a reduction in voltage indicating the pad 105 is being pulled low.

Figure 6:
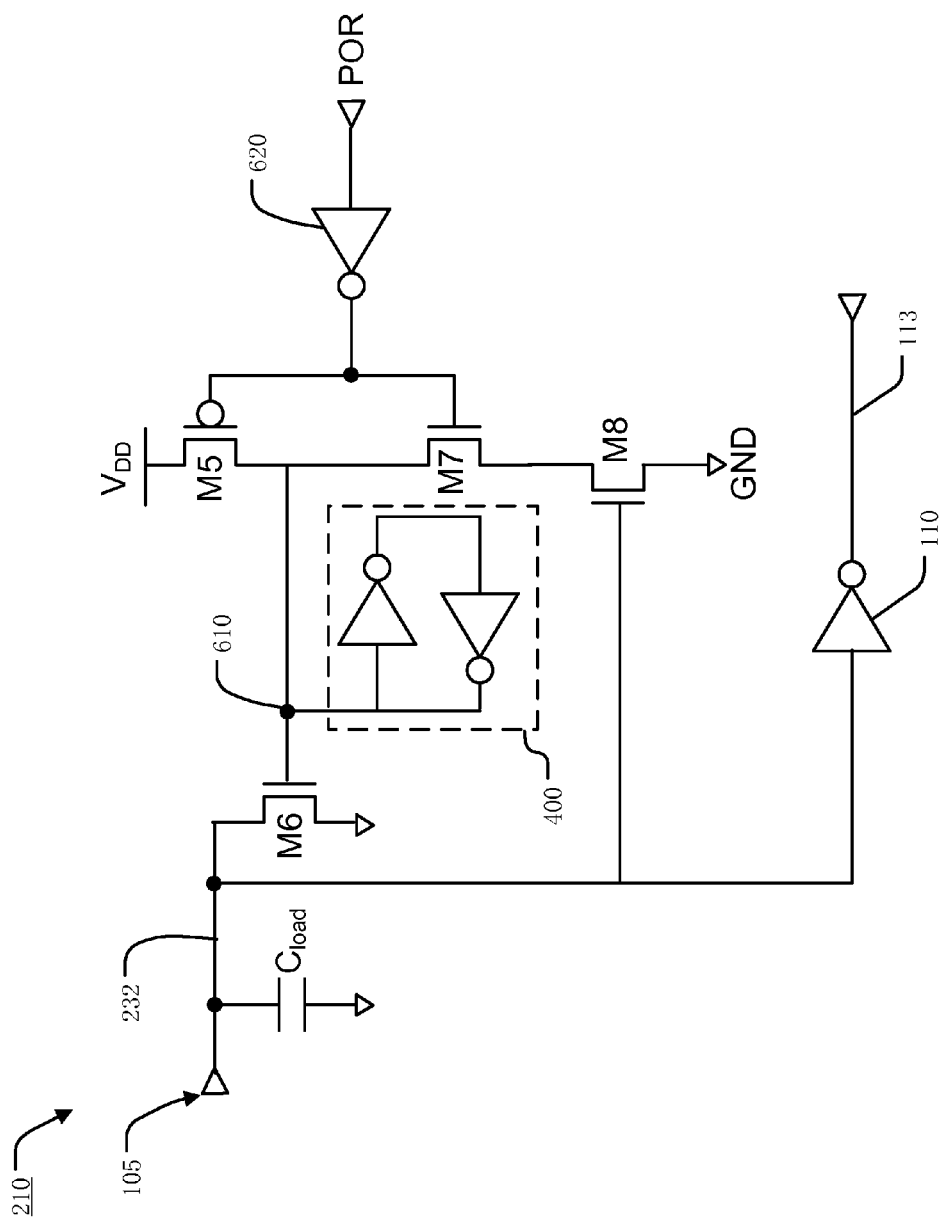
FIG. 6 is a schematic diagram of a second embodiment of the input buffer circuit of FIG. 2.

FIG. 6 illustrates a second embodiment of the input buffer circuit 210 used to pre-charge the pad to a low reference voltage (ground in this example) in response to the initialization event, and monitoring the voltage on the pad to detect a change indicating the pad is being pulled high.

As shown in FIG. 6, the input buffer circuit 210 includes an NMOS pass transistor M6 having a first conduction terminal connected to the output terminal 232, a second conduction terminal coupled to ground, and a control terminal coupled to latch circuit 400 at node 610. The pass transistor M6 is turned on and off to selectively couple the output terminal 232 to ground, depending upon whether the state of the latch is high or low.

Figure 7:
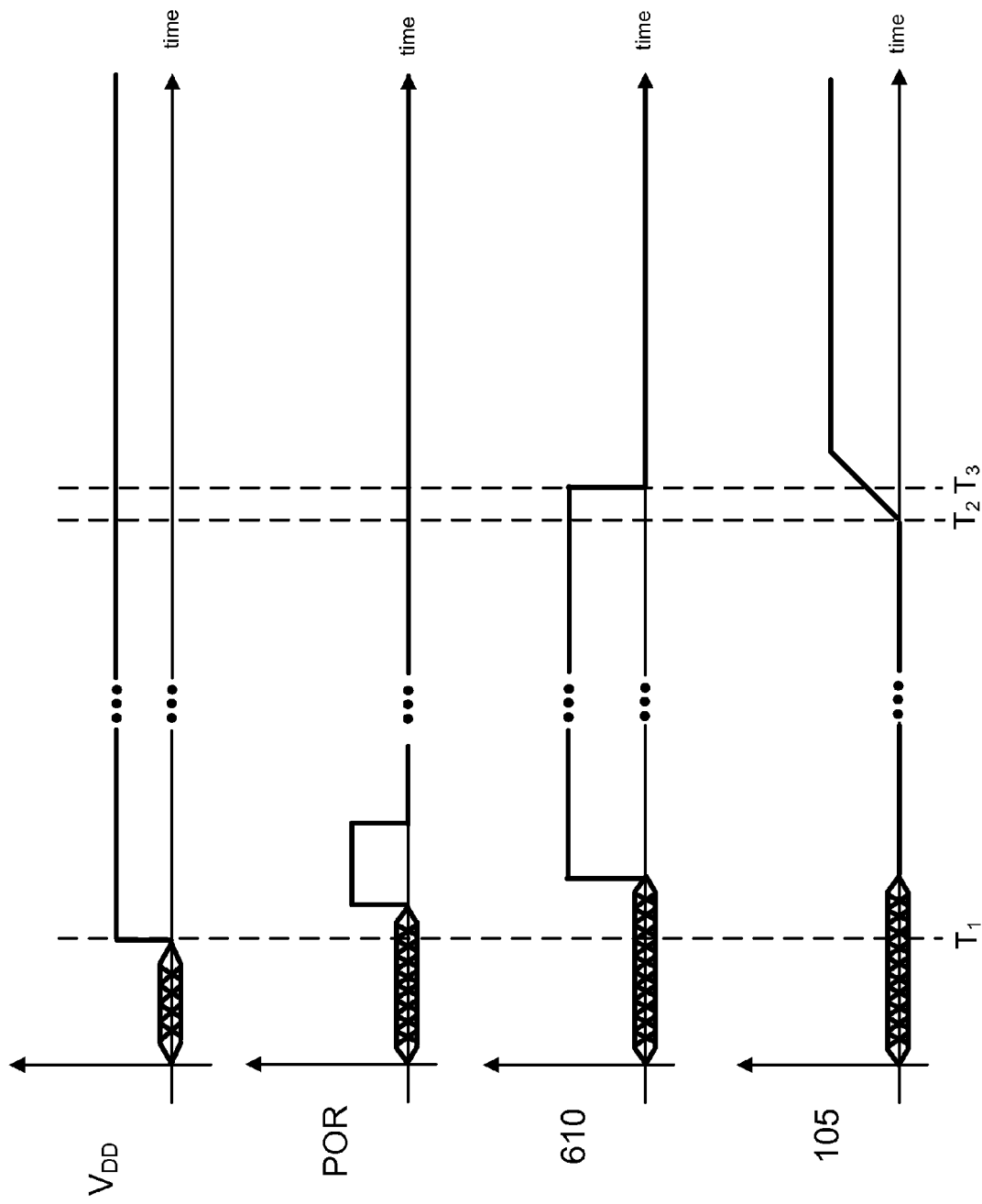
FIG. 7 illustrates a timing diagram for operating the architecture of FIG. 6.

FIG. 7 illustrates an embodiment of a timing diagram for operating the architecture of FIG. 6 using the methods described herein. As will be understood the timing diagram of FIG. 7 is simplified and not necessarily to scale.

In response to the initialization event at time $T_1$, the POR signal is set to a high state by the internal circuitry 240. The POR signal is inverted to a low state by inverter 620 to turn on transistor M5 and couple node 610 to $V_{DD}$, thereby resetting the latch 400 to a high state. Following the power on process, the POR signal is returned to a low state, which turns-off transistor M5 and turns on transistor M7.

The latch 400, when in the high state, turns on the pass transistor M6 to couple the output terminal to ground, thereby pre-charging and holding the pad 105 at ground. This prevents the pad 105 from floating following the initialization event, which ensures that the input buffer circuitry 210 is in a known state.

The pass transistor M6 is said to be "weak" in the sense that when a voltage greater than ground is asserted on the pad 105 by an internal or external driver, the driver provides a stronger pull-up action than the pull-down action of the pass transistor M6. The internal or external driver thus "wins", and changes the voltage on the pad 105.

At time $T_2$ a driver begins pulling up the voltage on the pad 105, and at time $T_3$ the voltage in pulled up above the threshold voltage of the NMOS feedback transistor M8. Turning on transistor M8 couples node 610 to ground, which sets the latch to a low state to turn off pass transistor M6. This electrically decouples the reference voltage $V_{DD}$ from the pad 105.

The low voltage on node 610 is then maintained by the low state in the latch 400 while the pad 105 is being driven by internal or external drivers, and thus the pass transistor M6 remains off. By turning off the pass transistor M6 when the pad 105 is being driven by internal or external drivers, the load of the "pre-charge" current path through the pass transistor M6 is removed, saving power and allowing higher speed operation.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device comprising:
   a pad adapted to receive an external signal;
   an input buffer circuit having an input terminal configured to receive the external signal from the pad, and having an output terminal providing the external signal as an input signal to internal circuitry of the integrated circuit, the input buffer circuit comprising:
   a pass transistor for providing a holding voltage to the pad; and
   a latch electrically configured to provide a control signal to a gate of the pass transistor, the latch having a first state in which the pass transistor is turned on connecting the holding voltage to the pad, and a second state in which the pass transistor is turned off disconnecting the holding voltage from the pad; and
   circuitry configured to set the control signal to the second state, in response to a change in voltage on the pad.

2. The device of claim 1, the circuitry configured to set the control signal to the second state including a transistor configured to receive a feedback signal from the pad to cause the latch to transition to the second state in response to a change in voltage on the pad.

3. The device of claim 1, wherein:
   the circuitry configured to set the control signal to the second state is responsive to an initialization event to establish the first state in the latch, and responsive to a change in voltage on the pad caused by the external signal to establish the second state in the latch.

4. The device of claim 3, wherein the circuitry configured to set the control signal to the second state includes a transistor having a control terminal adapted to receive a signal indicating a start of the initialization event, a first conduction terminal connected to a voltage adapted for establishing the first state in the latch, and a second conduction terminal connected to the latch.

5. The device of claim 3, wherein the initialization event is a power-up event.

6. The device of claim 1, further comprising an output buffer circuit having an input terminal for receiving an output signal from internal circuitry of the integrated circuit, and having an output terminal connected to the pad.

7. The device of claim 1, wherein the holding voltage is ground.

8. A method for operating an integrated circuit device, wherein a pad is adapted to receive an external signal, the method comprising:
   electrically connecting the pad to a holding voltage in response to an initialization event;
   monitoring voltage on the pad to detect a change in voltage indicating the pad is receiving an external signal; and
   upon detecting said change in the voltage on the pad, electrically disconnecting the pad from the holding voltage.

9. The method of claim 8, wherein:
   the step of electrically connecting the pad to the holding voltage comprises turning on a pass transistor providing the holding voltage to the pad, having a first conduction terminal electrically connected to the pad and having a second conduction terminal electrically connected to the bias voltage; and
   the step of electrically disconnecting the pad from the holding voltage comprises turning off the pass transistor.

10. The method of claim 9, wherein:
    turning on the pass transistor comprises establishing a first state at a control terminal of the pass transistor; and
    turning off the pass transistor comprises establishing a second state at the control terminal of the pass transistor.

11. The method of claim 10, including using a latch connected to the control terminal of the pass transistor to hold the first state and the second state.

12. The method of claim 10, wherein the change in voltage on the pad turns on a feedback transistor having a control terminal connected to the pad, a first conduction terminal connected to a reference voltage adapted for establishing the second state in the latch, and a second conduction terminal selectively connected to the latch.

13. The method of claim 10, wherein the step of establishing the first state in a latch comprises
    receiving a signal indicating a start of the initialization event to turn on a transistor having a first conduction terminal electrically connected to a bias voltage adapted for establishing the first state in the latch, and a second conduction terminal connected to the latch.

14. The method of claim 8, further comprising:
    receiving an output signal at an input terminal of an output buffer from internal circuitry of the semiconductor device, and providing the output signal from an output terminal of the output buffer to the pad.

15. The method of claim 8, wherein the initialization event is a power-up event.

16. An integrated circuit device comprising:
    a pad adapted to receive an external signal;
    an input buffer circuit having an input terminal connected to the pad, and having an output terminal providing the external signal as an input signal to internal circuitry of the integrated circuit; and
    means for holding the pad at a holding voltage when there is no external signal applied to the pad, and for releasing the pad from the holding voltage when an external signal is applied to the pad.

* * * * *